(12) United States Patent
Bjorn-Josefsen et al.

(10) Patent No.: US 8,126,164 B2
(45) Date of Patent: Feb. 28, 2012

(54) DIGITAL COMPENSATION OF ANALOG VOLUME CONTROL GAIN IN A DIGITAL AUDIO AMPLIFIER

(75) Inventors: Anker Bjorn-Josefsen, Lynge (DK); David E. Zaucha, Carrollton, TX (US); Thomas Morch, Soborg (DK)

(73) Assignee: Texas Instruments Incorporated, Dallas, TX (US)

( * ) Notice: Subject to any disclaimer, the term of this patent is extended or adjusted under 35 U.S.C. 154(b) by 1491 days.

(21) Appl. No.: 11/564,373

(22) Filed: Nov. 29, 2006

(65) Prior Publication Data

US 2008/0123873 A1    May 29, 2008

(51) Int. Cl.
*H03G 3/00* (2006.01)
*H03F 21/00* (2006.01)
(52) U.S. Cl. .................................. 381/109; 381/120
(58) Field of Classification Search .................. 381/104, 381/109, 120, 121, 56–58; 700/94
See application file for complete search history.

(56) References Cited

U.S. PATENT DOCUMENTS

| | | | |
|---|---|---|---|
| 2006/0103458 A1 | 5/2006 | Hansen et al. | |
| 2006/0126865 A1 | 6/2006 | Blamey et al. | |
| 2006/0247811 A1 | 11/2006 | Zaucha et al. | |
| 2006/0251270 A1* | 11/2006 | Yang et al. | 381/94.5 |
| 2006/0262473 A1 | 11/2006 | Neesgaard et al. | |

* cited by examiner

*Primary Examiner* — Ping Lee
(74) *Attorney, Agent, or Firm* — John J. Patti; Wade J. Brady, III; Frederick J. Telecky, Jr.

(57) ABSTRACT

A digital audio system including a combination of analog and digital volume control is disclosed. A variable power supply voltage biases a power amplifier for each channel, and applies a bias voltage corresponding to an analog volume control signal. In one disclosed embodiment, digital gain control circuitry compares the bias voltage with the level expected for the analog volume control signal; if the bias voltage has not dropped in response to a reduction in the analog volume control signal, the digital gain control circuitry reduces the digital gain of the input digital audio signal, until the bias voltage responds to the reduced volume. In another disclosed embodiment, modeling or characterization of the audio system is used to derive a digital gain control signal based on the desired volume signal and the amplitude of the digital audio signal itself. In another disclosed embodiment, a slew rate limiter slows the rate of change of the control signal applied to the variable power supply, in which case the slowed control signal is used in the comparison or calculations of the reduced digital gain.

22 Claims, 7 Drawing Sheets

DIGITAL COMPENSATION OF ANALOG VOLUME CONTROL GAIN IN A DIGITAL AUDIO AMPLIFIER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital audio systems, and is more specifically directed to audio volume control in such digital audio systems.

In recent years, digital signal processing techniques have become prevalent in many electronic systems. Tremendous increases in the switching speed of digital circuits have enabled digital signal processing to replace, in large part, analog circuits in many applications. For example, the sampling rates of modern digital signal processing are sufficiently fast that digital techniques have become widely implemented in audio electronic applications. These digital audio signal processing techniques now extend even to the driving of the audio output amplifiers.

As a result of these advances in digital audio amplifiers, and advances in digital signal processing generally, audio receivers can now be realized nearly entirely in the digital domain. To the extent that audio signals remain to be processed, these digital receivers can convert any received analog audio input signals to digital form, and process the corresponding signals in a similar manner as the other digital audio signals in the system.

Of course, an important user control in digital audio systems, as in any audio system, is the control of the output volume. In conventional digital audio systems, a system controller periodically polls the position of a front panel actuator, such as a knob or slider, to read the current desired audio volume setting. Upon detecting changes in position of the actuator as the human user changes the desired audio volume, the system controller adjusts the audio volume to the desired level by applying corresponding control signals to the audio amplifier. The actual application of volume control to the amplifier output stage, in conventional digital audio systems, can be accomplished either in the digital domain or in the analog domain. It has been discovered, in connection with this invention, that each of these approaches has limitations in important situations, as will now be described.

Figure 1:
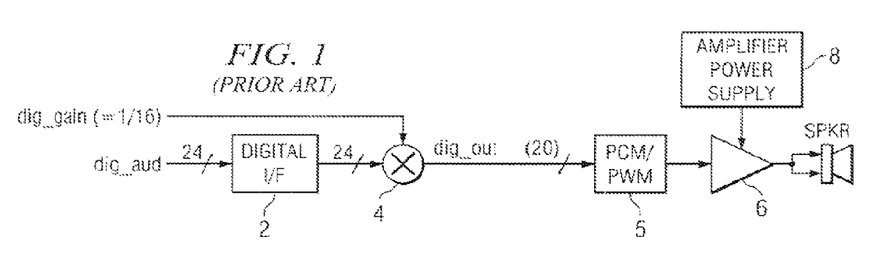
FIG. 1 is an electrical diagram, in block form, of a conventional digital volume control circuit in a digital audio system.

FIG. 1 illustrates a conventional digital volume control arrangement for a channel of a conventional digital audio system. Of course, multiple channels similarly arranged may be realized in the digital audio system, as well-known in the art. Digital interface 2 receives digital audio signal dig_aud from a digital source, such a source typically being digital signal processing circuitry in a digital audio receiver, or the like. In most modern digital audio systems, this digital audio signal dig_aud is typically in the form of a pulse-code-modulation (PCM) control signal, which will be converted by PCM-PWM function 5 into a PWM duty cycle applied to class D output driver 6, which operates as a switching power stage that drives a signal applied to speaker SPKR as shown in FIG. 1. In this switching power stage output driver 6, the output signal amounts to the voltage applied to output driver 6 from amplifier power supply 8, pulse-width-modulated by the audio signal from PCM-PWM function 5 according to the audio stream. PWM is a common modulation scheme in conventional digital audio systems, because it operates according to a linear relationship between the power supply rail voltage and the output level. Of course, output driver 6 may be controlled according to another type of modulation than PWM, such modulation approaches operating according to non-linear but deterministic relationships between the rail voltage and the output level, as known in the art. In this example, digital audio signal dig_aud is presented as a twenty-four bit digital word. Digital interface 2 buffers digital audio signal dig_aud, and presents one twenty-four bit word at a time to digital gain stage 4.

In this conventional digital volume control circuit, digital gain stage 4 applies an attenuation to digital audio signal dig_aud in response to a digital volume control signal dig_gain, received from controller circuitry or the like in the digital audio system, and which corresponds to a user volume control input. In this conventional circuit, digital gain stage 4 typically reduces the volume of buffered digital audio signal dig_aud by multiplying the digital audio values by a gain value. For example, if the desired volume indicated by digital volume control signal dig_gain is to be one-sixteenth that (or −18.0618 dB from) full volume, digital gain stage 4 reduces the volume by digitally multiplying the twenty-four bit value of digital audio-signal dig_aud by a digital value corresponding to $1/16$. In effect, this digital gain reduction results in the discarding of least significant bits of digital audio signal dig_aud. Output audio signal dig_out from digital gain stage 4 has (in this example) twenty significant bits, as indicated by the (20) indication on output audio signal dig_out from digital gain stage 4. This output is applied to PCM-PWM function 5, which generates PWM control signals applied to digital power amplifier 6, which is a fixed-gain amplifier that drives speaker SPKR in the conventional manner. In this example, digital amplifier 6 is biased by amplifier power supply 8, which presents a fixed bias voltage to digital amplifier 6.

In the digital volume control circuit of FIG. 1, as evident from this description, the output signal dig_out that drives amplifier 6 and speaker SPKR loses resolution as its volume is decreased. This loss of resolution is the direct result of the digital multiplication applied by digital gain stage 4, in which one or more least significant bits of digital audio signal dig_aud are stripped; for the example of reducing volume to a one-sixteenth level (−18.0618 dB), the information in the four least significant bits is lost. This loss of resolution is especially evident in "soft" audio passages, for which the digital values of digital audio signal dig_aud are relatively low (i.e., occupy relatively few significant bits) before the low volume gain is applied. Accordingly, the sound fidelity of the digital audio system at lower volumes, especially as applied to soft passages, is adversely affected by this digital volume control approach.

Figure 2:
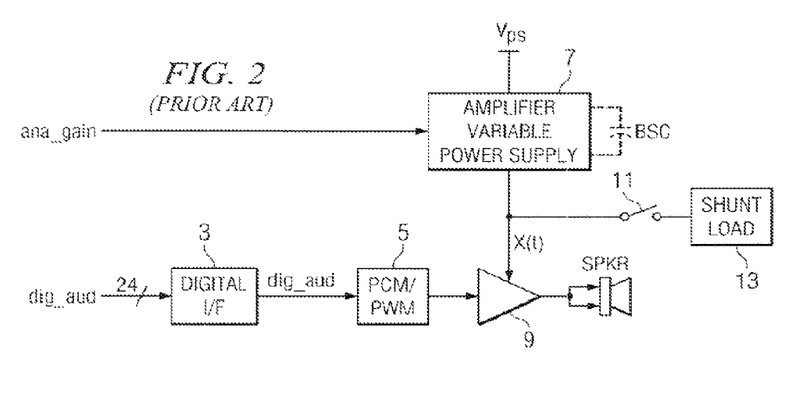
FIG. 2 is an electrical diagram, in block form, of a conventional analog volume control circuit in a digital audio system.

FIG. 2 illustrates a conventional analog volume control arrangement for a digital audio system. As in the case of the circuit of FIG. 1, the output signal applied to speaker SPKR is driven by a switching power output stage, presented by power amplifier 9, that drives speaker SPKR from a power supply "rail" voltage, modulated according to the audio stream (i.e., the audio content). Analog volume control of this conventional switching power stage of FIG. 2 is accomplished by control of the rail voltage applied to the switching power stage of power amplifier 9, in response to a digital or analog volume control signal.

In the arrangement of FIG. 2, digital audio signal dig_aud is again received by digital interface 3, which may buffer each word of digital audio signal dig_aud, and passes along digital audio signal dig_aud directly to the power stage of variable gain digital amplifier 9, via PCM-PWM converter function 5. In this conventional analog volume control arrangement, the gain applied by variable gain digital amplifier 9 is controlled by a power supply voltage X(t) from amplifier variable power supply 7. Amplifier variable power supply 7 is, in turn, controlled by a signal ana_gain that corresponds to the desired volume level indicated by a user input or the like; amplifier variable power supply 7 produces voltage X(t) at a level reduced from a power supply voltage $V_{sc}$, which is provided by power supply circuitry (not shown) based on an external power supply. Amplifier 9 drives speaker SPKR according to the PWM signal from PCM-PWM function 5, at levels depending directly on the power supply voltage X(t) applied to it by power supply 7; as such, the output drive of amplifier 9 is reduced as power supply voltage X(t) is controlled by the signal ana_gain. According to this PWM implementation, the output level has a substantially linear relationship with the rail voltage X(t) from amplifier variable power supply 7. Of course, other modulation techniques besides PWM, some of which can involve non-linear relationships between the rail voltage and the output level, are also known in the art.

An advantage of the conventional analog volume control arrangement of FIG. 2, relative to the digital volume control of FIG. 1, is that resolution and fidelity in the audio signal is not lost at lower volume levels, because the precision of digital audio signal dig_aud remains constant over the entire volume range. However, it has been observed that the instantaneous performance of this analog volume control arrangement is inaccurate as the volume is reduced, as will now be described.

As shown in FIG. 2, bulk storage capacitance BSC is present within amplifier variable power supply 7. This bulk storage capacitance BSC is charged by the power supply circuitry as the volume is increased; typically, this power supply circuitry has sufficient drive to charge bulk storage capacitance BSC so that voltage X(t) follows the rate of the desired volume increase. However, in conventional arrangements such as shown in FIG. 2, there is no "sink" path provided for power supply 7, other than that of amplifier 9. Accordingly, if a lower desired volume level is indicated by signal ana_gain, the power supply output X(t) may not immediately be reduced, and as such the actual audio output volume at speaker SPKR may not instantaneously fall. This lack of response is especially noticeable if the level of audio signal dig_aud is at a low level when the volume is reduced, because power stage 6 is operating at a relatively low duty cycle and thus only slowly discharges the bulk storage capacitance. In this situation, the volume reduction demanded by signal ana_gain does not occur until a louder passage of digital audio signal dig_aud occurs, permitting amplifier 9 to rapidly discharge the bulk storage capacitance BSC. This undesirable data-dependent lag in volume reduction is, of course, noticeable to the listener.

A conventional approach to this problem is also illustrated in FIG. 2. Voltage controlled switch 11 directs excess current from the output of amplifier variable power supply 7 to shunt load 11, in situations in which the output X(t) from amplifier variable power supply 7 remains high relative to the desired output level indicated by signal ana_gain. Switch 11 and shunt load 13 thus help to improve the response of this analog volume control circuitry, particularly to assist in the reduction of volume. However, shunt load 13 is necessarily implemented as a resistor, and as such generates heat from the $I^2R$ power it dissipates. Rapid volume changes that cause frequent closing of switch 11, and thus a relatively large amount of current into shunt load 11 over time, will thus generate substantial heat in the system, which is especially undesirable in portable digital audio systems, which are miniaturized as much as practicable.

BRIEF SUMMARY OF THE INVENTION

It is therefore an object of this invention to provide a volume control circuit and method of controlling volume, for a digital audio system, in which the fidelity of the audio signal, even in soft passages, is maintained.

It is a further object of this invention to provide such a circuit and method that does not consume excess power in achieving low volume output.

It is a further object of this invention to provide such a circuit and method that can be readily implemented into modern digital audio systems without requiring external components or different manufacturing technologies.

It is a further object of this invention to provide such a circuit and method that is compatible with, and thus does not require changes in, the digital audio stream or processing.

It is a further object of this invention to provide such a circuit and method that is applicable to switching power stages operating according to various modulation approaches, including pulse-width-modulation (PWM), sigma-delta modulation, and other linear modulation techniques, as well as according to non-linear but deterministic modulation techniques.

Other objects and advantages of this invention will be apparent to those of ordinary skill in the art having reference to the following specification together with its drawings.

The present invention may be implemented into a volume control system in a digital audio system, and method of operating the same, in which both analog and digital controls are used. Analog control is applied to a variable power supply, which biases and thus controls a variable gain digital amplifier that drives the output stage and thus the speaker. According to one embodiment of the invention, a digital gain control circuit monitors the output of the variable power supply and, responsive to a difference between the requested volume level and the output of the variable power supply, applies a digital attenuation (e.g., multiplication of the digital word applied to the amplifier by a gain value) to the digital audio signal. Upon the output of the variable power supply matching the requested volume level, the digital attenuation is removed. In another embodiment of the invention, the digital gain control circuit applies digital attenuation to the digital audio signal for a duration and at a level based on modeling or characterization of the response of the system to changes in the requested volume levels. In another embodiment of the invention, the volume control signal is slowed by a slew-rate controller so that, in decreasing volume situations, the control signal applied to the variable power supply exhibits approximately the response of the variable power supply; the slowed output signal from the slew-rate controller controls the digital attenuation, rather than a measurement of the analog power supply voltage itself. According to this invention, therefore, instantaneous volume control appears at the digital audio system output, while minimizing the loss of information and fidelity in the signal, and without requiring shunt load devices.

DETAILED DESCRIPTION OF THE INVENTION

The present invention will be described in connection with its preferred embodiment, namely as implemented into a digital audio receiver with a switching power stage, because it is contemplated that this invention is especially beneficial when utilized in such an application. However, it is contemplated that other applications may also benefit from this invention. Accordingly, it is to be understood that the following description is provided by way of example only, and is not intended to limit the true scope of this invention as claimed.

Figure 3:
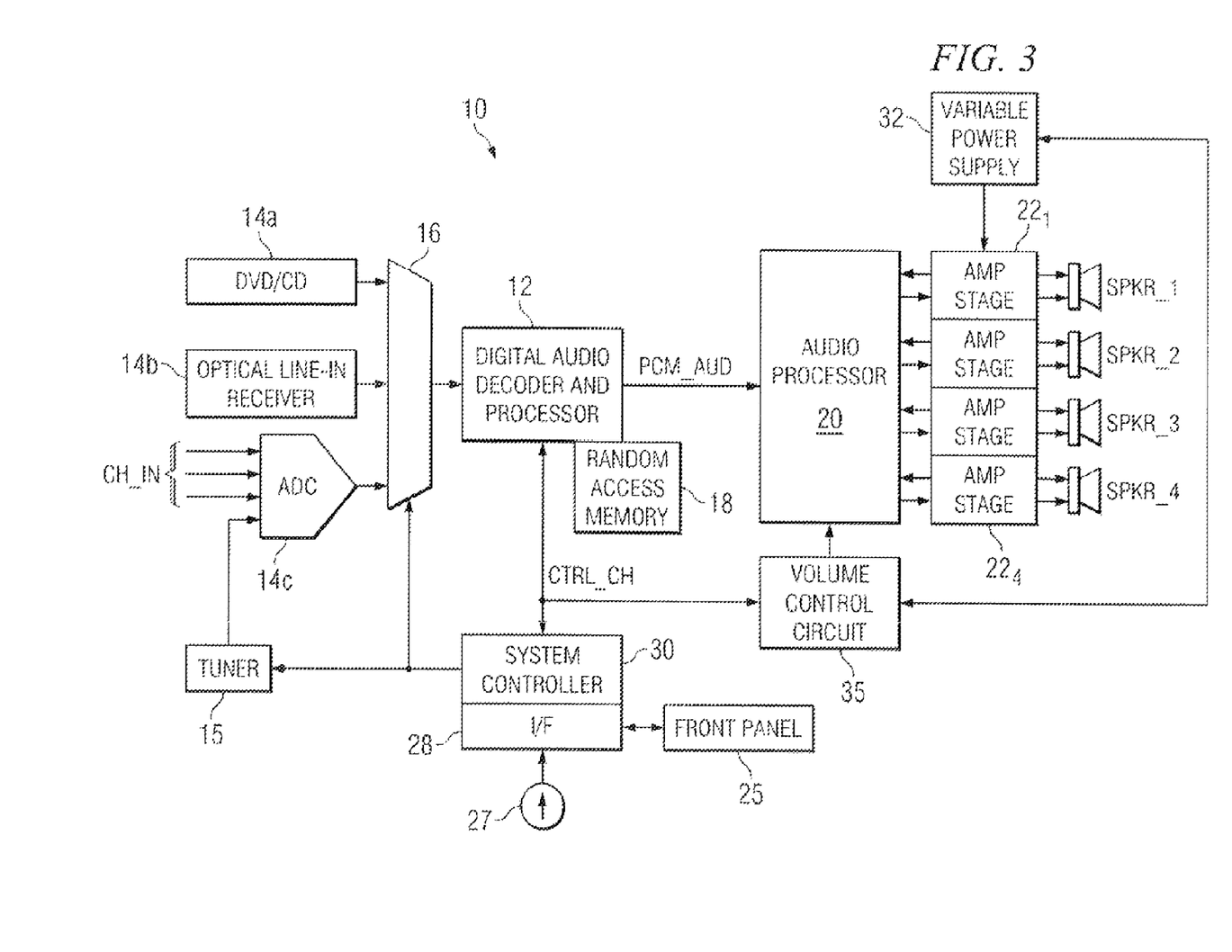
FIG. 3 is an electrical diagram, in block form, of a digital audio-visual receiver constructed according to the preferred embodiments of the invention.

Referring now to FIG. 3, the construction of audio processing circuitry in digital audio receiver 10 according to the preferred embodiments of the invention will now be described. Receiver 10 may be implemented into an audio-video receiver, in which case video data paths (not shown) will also be provided, substantially in parallel with the audio processing functions shown in FIG. 3. In the example of receiver 10, multiple sources of audio signals are available to receiver 10, and may be processed into output audio by digital audio decoder and processor 12. Multiplexer 16 receives digital audio from DVD/CD controller 14a, such audio corresponding to audio content in conjunction with DVD movies or audio CDs played on a player (not shown) to which receiver 10 is connected. Optical line-in receiver 14b provides digital audio, for example from satellite or cable television sources, to another input of multiplexer 16. Analog-to-digital converter (ADC) 14c converts analog stereo signals from analog line-in inputs CH_IN and from tuner 15 to a digital datastream, and provides this datastream to another input of multiplexer 16. Multiplexer 16 chooses from among these inputs, along with inputs from other sources if available, for application to digital audio decoder and processor 12, under the control of system controller 30. The selection of audio source effected by multiplexer 16 is under user control; in this regard, system controller receives direct selection inputs from front panel switches 25 of receiver 10, or infrared remote control signals via infrared receiver 27, both communicating with system controller 30 via interface circuitry 28.

Digital audio decoder and processor 12 is a conventional integrated circuit, or integrated circuit core, for decoding and digitally processing the digital audio signals from multiplexer 16. Alternatively, digital audio decoder and processor 12 may be implemented as part of a larger-scale integrated circuit for decoding and processing digital video and audio signals, an example of which is an MPEG-2 decoder implemented using a digital signal processor such as from the DA610 class of digital signal processors available from Texas Instruments Incorporated. In either case, functions performed by digital audio decoder and processor 12, in combination with its random access memory 18, include decoding of the incoming digital data, applying the various digital audio data to corresponding channels supported by receiver 10, applying digital filters as desired, and formatting the digital audio data into a pulse-code-modulated (PCM) format, in this example. The PCM signals for each channel are then forwarded to audio processor 20.

Audio processor 20 is a conventional device for converting the PCM digital audio signals at its inputs to modulated signals that drive the corresponding channel speakers SPKR, to an audio volume for each channel corresponding to digital commands communicated from system controller 30 over digital serial interface CTRL_CH which is preferably a relatively low-bandwidth digital serial interface such as of the well-known I$^2$C or SPI types. Audio processor 20 preferably includes a preamplifier stage, which amplifies the incoming PCM signal to a desired level; according to this preferred embodiment of the invention, digital control of the audio volume is applied at this preamplifier stage. In addition, as will be described below, volume control is also performed at a later amplification stage within audio processor 20, specifically at power amplifier stages $22_1$ through $22_4$. Audio processor 20 includes volume command processor 35, which receives the digital commands from system controller over digital serial interface CTRL_CH, and controls the adjustment of the audio volume for each channel according to the preferred embodiment of the invention, as will be described in further detail below.

Audio processor 20 also preferably includes conventional circuitry for performing the conventional functions of parametric speaker equalization or "voicing", implementation of graphic equalizer presets, treble and bass adjustment, and precision soft volume control on the audio signal being processed for its channel. Other digital functions that can be performed by audio processor 20 include loudness compensation to boost bass frequencies when the output for the channel is low, dynamic range compression, background noise floor compensation or noise squelch, center or subwoofer channel synthesis, programmable dither, peak limiting and clipping, and other digital filter processing. These functions are typically performed by the application of biquad, or second-order IIR, digital filters in a cascade arrangement. A preferred example of this and other processing performed by audio processor 20 is described in copending application Ser. No. 10/988,268, filed Nov. 12, 2004, and entitled "On-the-Fly Introduction of Interchannel Delay in a Pulse-Width-Modulation Amplifier".

In this example, audio processor 20 processes digital audio signals to produce corresponding pulse-width-modulated (PWM) output signals for four channels. For each of these four channels, audio processor 20 produces separate PWM control signals that are applied to a corresponding power amplifier stage $22_1$ through $22_4$, each of which drives a respective one of loudspeakers SPKR_1 through SPKR_4, as shown in FIG. 3. Of course, more or fewer audio channels may be driven by receiver 10. In a simple stereo arrangement, only two channels may be processed; alternatively, as many as eight audio channels are now commonly handled by digital audio-visual receivers such as receiver 10. The number of channels supported and utilized by receiver 10 is a matter of choice for the designer and the user.

According to this preferred embodiment of the invention, the bias voltage applied to each of power amplifier stages $22_1$ through $22_4$ is provided by variable power supply 32. Variable power supply 32 provides an output bias voltage to power amplifier stages 22 at a voltage controlled by volume control circuit 35, also in response to digital commands from system controller 30 over digital serial interface CTRL_CH. As will be evident from the following description of the invention, volume control circuit 35 also can sense the voltage output level of variable power supply 32, in one of the preferred embodiments of the invention, and use this sensed voltage level in its volume control of audio processor 20; as such, the control line between volume control circuit 35 and variable power supply 32 is shown as bidirectional in this example. Control of the output volume by modulation of variable power supply 32 may be performed individually for each channel, or alternatively may be performed on all channels at once.

As evident from this description, the example of audio processing circuitry in digital audio receiver 10 according to the preferred embodiments of the invention utilizes pulse-width modulation (PWM) techniques to modulate the application of a power supply rail voltage and ground, according to the audio stream or audio content, in a pulse-width modulated fashion. As known in the art, PWM is one of several modulation approaches that result in a linear relationship between the power supply rail voltage from variable power supply 32, and the output level driven by power amplifier stages 22. It is contemplated, however, that each of the preferred embodiments of this invention is also applicable to digital audio circuitry operating according to other modulation approaches. These other modulation approaches include other linear modulation techniques such as sigma-delta modulation, and also include modulation techniques that have a non-linear, yet deterministic, relationship between rail voltage and output level. It is contemplated that those skilled in the art will be readily able to implement this invention in digital audio systems operating according to such modulation approaches.

In FIG. 3, digital audio decoder and processor 12, audio processor 20, and memory 18 are illustrated as separate functions. It is contemplated, however, that these digital functions may be readily integrated into a single integrated circuit, and indeed such integration is preferred for the benefits of reduced manufacturing cost, improved device matching, and the like. Of course, these functions may be realized in separate integrated circuits in the alternative, as appropriate.

As mentioned above, system controller 30 provides audio source selection signals to multiplexer 16, and channel volume control signals to volume command processor 35 in audio processor 20. System controller 30 also provides other control signals throughout receiver 10, including channel selection control to tuner 16 in response to user inputs received via front panel 25 or infrared receiver 27, and operational control signals applied to digital audio decoder and processor 12, also over a digital serial interface CTRL_CH in this example. As mentioned above, digital serial interface CTRL_CH may be implemented according to conventional control interface approaches, including the well-known I²C and SPI interface techniques. In any event, according to the preferred embodiment of this invention, volume command processor 35 includes circuitry for smoothly controlling changes in audio volume to be applied by audio processor 20 to each of its audio channels, as will now be described in further detail.

Figure 4:
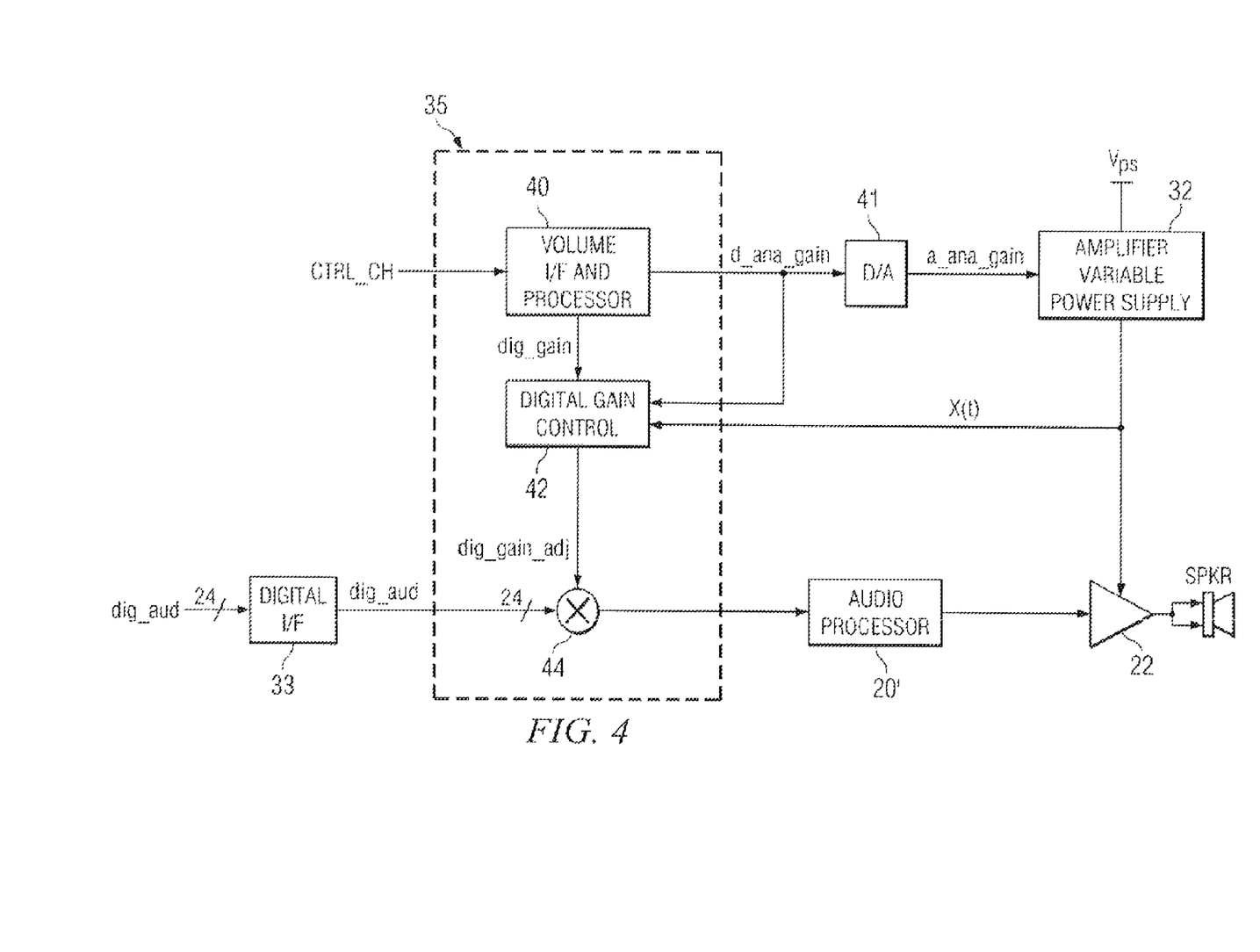
FIG. 4 is an electrical diagram, in block form, of output stage circuitry for a channel of a digital audio system such as shown in FIG. 3, constructed according to a first preferred embodiment of the invention.

Referring now to FIG. 4, the construction of volume control circuit 35, and its operation in connection with one channel output by receiver 10, by way of example, will now be described in further detail. Of course, it is contemplated that volume control circuit 35 will operate similarly in connection with each of the multiple audio channels served by receiver 10, either individually or simultaneously over all channels, as desired for the particular system.

Digital audio data signal dig_aud for this channel is received at digital interface 33, which buffers the digital values (preferably in the form of a pulse-coded-modulation signal), as described above. Signal dig_aud is then applied to digital gain stage 44, the output of which is applied to audio processor 20' for this channel. It is contemplated that audio processor 20' as shown in this example of FIG. 4 will include a PCM-PWM conversion function, along with such other processing functions and filters as appropriate for the particular application. Of course, as mentioned above, the particular modulation of the signals output by audio processor 20' may follow a different modulation scheme, as desired for the particular system implementation. In addition, it is contemplated that some of the functions of audio processor 20 (FIG. 3) may be performed upstream from digital gain stage 44; such additional functions are not shown in FIG. 4 for the sake of clarity. It is contemplated that those skilled in the art having reference to this specification, and to the specification of commonly assigned copending application Ser. No. 10/988,268, filed Nov. 12, 2004, and entitled "On-the-Fly Introduction of Interchannel Delay in a Pulse-Width-Modulation Amplifier" incorporated herein by reference, will be readily able to realize the functionality of audio processor 20' for this particular channel. In any event, it is contemplated that digital gain stage 44 is preferably applied to the digital audio signal dig_aud in its PCM form, rather than after conversion to a PWM pulse train; this permits gain stage 44 to be realized as a digital multiplier function, simplifying the circuit design.

The output of gain stage 44 is applied to audio processor 20', which as mentioned above applies its pulse-width-modulated output signal to power amplifier 22. For example, power amplifier 22 may be realized as a class "D" amplifier stage, to facilitate driving speaker SPKR in response to the PWM signal from audio processor 20'. The amplitude of the output drive signal applied to speaker SPKR depends on the voltage level X(t) applied to power amplifier 22 by amplifier variable power supply 32; the overall energy of this drive signal over time is of course determined by the duty cycle of the drive signal in response to the PWM signal applied to power amplifier 22. Amplifier variable power supply 32 may be constructed in the conventional manner for controllable power supply circuits, and as such it is contemplated that those skilled in the art having reference to this specification will be readily able to realize this function.

According to this first preferred embodiment of the invention, volume interface and processor function 40 in volume control circuit 35 receives a volume control input signal from system controller 30 over digital serial interface CTRL_CH. It is contemplated that those skilled in the art having reference to this specification will be readily able to construct volume interface and processor function 40, to perform the functions described therein, using the appropriate digital circuitry as necessary for the domain of the input and output signals and the preferred construction of receiver 10.

In operation, volume interface and processor function 40 generates digital-domain analog volume control signal d_ana_gain and a digital volume command dig_gain in response to the volume command for this channel (or for all channels simultaneously, as mentioned above). Digital-domain volume control signal d_ana_gain is converted by digital-to-analog converter (DAC) 41 into an analog-domain analog volume control signal a_ana_gain, which is applied to amplifier variable power supply 32. Amplifier variable power supply 32 modulates the output power supply voltage X(t) applied to power amplifier 22, in response to analog volume control signal a_ana_gain. Output power supply voltage X(t) determines the drive of power amplifier 22 and thus controls the output audio volume, in an "analog" manner, substantially in the manner described above relative to FIG. 2. Considering the volume control signals as gain levels, the digital volume command dig_gain (in dB) amounts to the difference between the incoming volume command for this channel (or for all channels simultaneously, as mentioned above) and the digital domain analog volume control signal d_ana_gain (in dB). As evident from FIG. 4, digital domain analog volume control signal d_ana_gain and analog domain analog volume control signal a_ana_gain indicate an equivalent volume level.

Alternatively, amplifier variable power supply 32 may be constructed so that it may receive digital-domain analog volume control signal d_ana_gain, in which case DAC 41 is not necessary. Regardless of the domain of the control signal applied to amplifier variable power supply 32, however, the volume control function of amplifier variable power supply 32 and power amplifier 22 is effectively an "analog" volume control, and as such the control signal applied to amplifier variable power supply 32 is referred to in this specification as an "analog" volume control signal, regardless of whether the signal itself is digital or analog.

Referring back to FIG. 4, according to this preferred embodiment of the invention, volume control circuit also includes digital gain control 42, which has inputs receiving digital volume control signal dig_gain and the digital domain analog volume control signal d_ana_gain, and also an input receiving the current voltage level X(t) output from amplifier variable power supply 32. Digital gain control 42 includes comparison circuitry for comparing the voltage level X(t) against the current value of digital-domain analog volume control signal d_ana_gain, as well as circuitry for converting the format (digital, analog, etc.) and levels or ranges of these signals to perform that comparison.

Figure 5A:
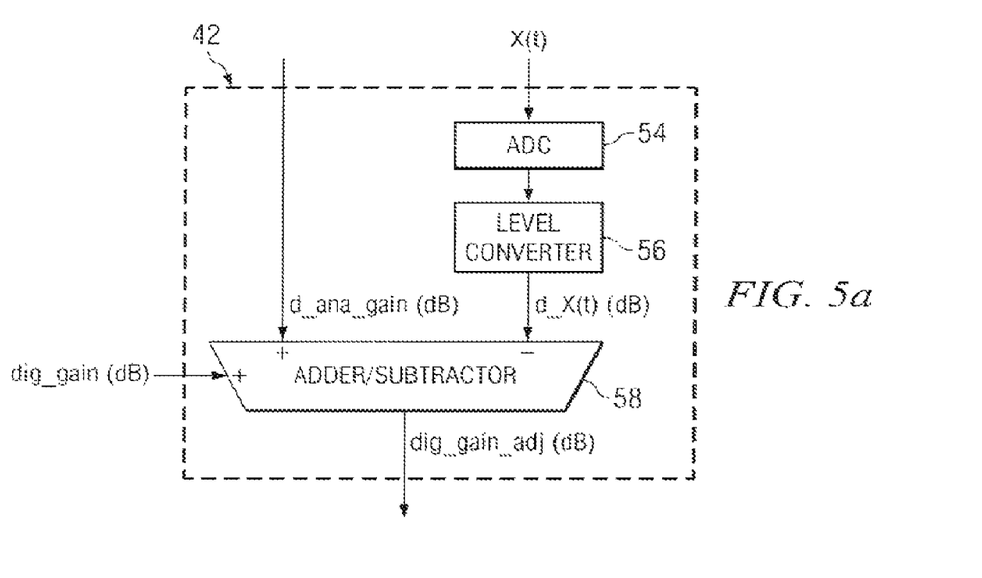
FIGS. 5a and 5b are electrical diagrams, in block form, of volume control circuitry in the circuitry of FIG. 4, constructed according to the first preferred embodiment of the invention.

FIGS. 5a and 5b illustrate, in block form, examples of the construction of digital gain control 42 according to this first preferred embodiment of the invention. FIG. 5a shows the signals in digital gain control 42 as gain levels (in dB space). In this implementation, analog-to-digital converter 54 receives and samples analog voltage X(t) from amplifier variable power supply 32, and generates a digital value for each sample; level converter 56 formats the digital output of ADC 54 to the appropriate number of bits and digital dynamic range, etc., to produce digital voltage signal d_X(t), as a dB gain level. Digital-domain analog volume control signal d_ana_gain (in dB) and digital voltage signal d_X(t) (also in dB) are applied to inputs of digital adder/subtractor 58, as is digital volume command signal dig_gain (which may also be level-converted as necessary, and which is expressed as a dB gain level). Digital adder/subtractor 58 generates adjustment signal dig_gain_adj (in dB) at its output in response to this comparison between digital-domain analog volume control signal d_ana_gain and digital voltage signal d_X(t), as applied to digital volume command signal dig_gain. The adjustment signal dig_gain_adj, in dB, corresponds to the volume level indicated by digital volume command signal dig_gain, reduced by an amount corresponding to the extent that the actual volume level (represented by the current voltage X(t) from amplifier variable power supply 32) exceeds the desired volume gain (represented by the digital-domain volume control signal d_ana_gain, in dB).

Figure 5B:
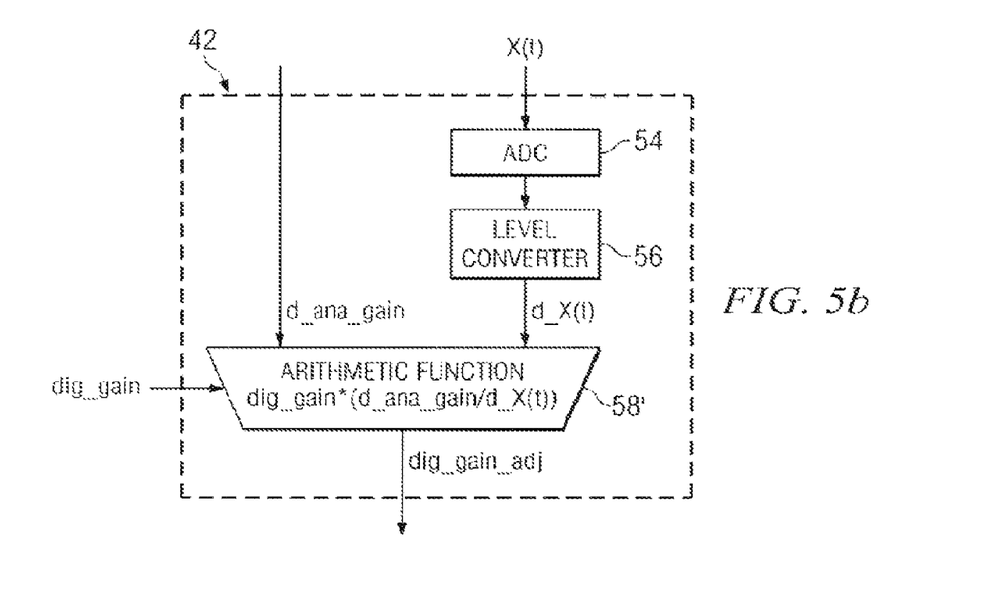

FIG. 5b illustrates digital gain control 42 in "linear space", in which the various signals and operations are analog voltages or digital signal values. In this implementation, analog voltage X(t) is again converted to the digital domain by ADC 54, and level converted by level converter 56 to produce a digital voltage signal d_X(t), which is applied to arithmetic function 58'. Digital-domain analog volume control signal d_ana_gain and digital volume command signal dig_gain, both expressed as digital signal levels, are also applied to arithmetic function 58'. Arithmetic function 58' produces digital adjustment signal level dig_gain_adj to correspond to the volume level indicated by digital volume command signal dig_gain, scaled by an amount corresponding to the ratio of the desired volume level (represented by the digital-domain volume control signal d_ana_gain) and the actual volume level (represented by the voltage X(t) from amplifier variable power supply 32).

In either case, the value of adjustment signal dig_gain_adj thus determines the gain reduction to be applied by digital gain stage 44. The value of adjustment signal dig_gain_adj may be held at the level indicated by digital volume command signal dig_gain (i.e., no gain increase) if the variable power supply voltage X(t) is below or at the level of analog volume control signal ana_gain. Digital gain stage 44 (FIG. 4) thus applies a digital gain that is at the level of digital volume control signal dig_gain, reduced by the extent to which the voltage level X(t) currently exceeds its commanded value indicated by digital-domain analog volume control signal d_ana_gain.

In the operation of this first preferred embodiment of the invention, according to either of these implementations, an attenuating digital volume adjustment signal dig_gain is generated in response to the variable power supply voltage X(t) lagging a reduction in the desired volume level indicated by digital-domain analog volume control signal d_ana_gain. As discussed above, it has been observed that the output audio volume as driven by power amplifier 22 may not immediately respond to a reduction in the desired volume indicated by analog volume control signal ana_gain, due to bulk storage capacitance at or within amplifier variable power supply 32. This lag in volume reduction results from the absence of a current sink path from this capacitance, other than that provided by power amplifier 22. Therefore, once this capacitance is charged by a relatively high output voltage X(t), voltage X(t) may remain at that high level even after digital-domain analog volume control signal d_ana_gain is reduced. This lag is especially evident in "soft" audio passages, in which the digital audio signal dig_aud has relatively small PCM values, because the corresponding low duty cycle of the PWM signal limits the rate at which power amplifier 22 can discharge voltage X(t).

According to this first preferred embodiment of the invention, digital gain control 42 operates to reduce the level of the digital signal provided to audio processor 20', in those situations in which the voltage X(t) has not fallen to match the desired volume indicated by digital-domain analog volume control signal d_ana_gain. For example, if the desired volume level indicated by digital-domain analog volume control signal d_ana_gain is one-sixteenth of full volume (−18.0618 dB), but the voltage X(t) generated by amplifier variable power supply 32 has not fallen from full volume because of the bulk storage capacitance that remains charged, digital gain control 42 applies digital adjustment signal dig_gain_adj at a value of one-sixteenth (−18.0618 dB) of the full volume indicated by digital volume command signal dig_gain, and applies this adjustment signal dig_gain_adj to digital gain stage 44. Digital gain stage 44 applies this gain reduction, for example by digitally multiplying the (PCM) digital audio signal dig_aud by adjustment signal dig_gain_adj. This product will be reflected in a reduction in the PWM duty cycle applied to power amplifier 22 by audio processor 20', which reduces the volume from speaker SPKR even with voltage X(t) remaining at a high level. The desired volume reduction thus occurs sooner than it would occur with a pure analog volume control as in FIG. 2 discussed above, and without requiring a shunt load.

As the voltage X(t) is eventually discharged by power amplifier 22 and reaches the desired level indicated by digital-domain analog volume control signal d_ana_gain, the digital gain reduction applied by digital gain control 42 also reduces the corresponding difference between digital volume command signal dig_gain and adjustment signal dig_gain_adj, until no additional attenuation is applied by digital gain stage 44 upon voltage X(t) reaching its desired level. When the amount of attenuation of digital audio signal dig_aud is within the attenuation range supported by digital-domain analog volume control signal d_ana_gain, adjustment signal dig_gain_adj is effectively at unity gain. Under these conditions, when the voltage X(t) reaches the desired level, digital gain stage 44 applies unity gain (i.e., the full volume indicated by digital volume command signal dig_gain) to digital audio signal dig_aud, such that the audio volume is controlled entirely at power amplifier 22.

It is recognized that the application of the digital gain reduction at digital gain stage 44 will result in loss of resolution and fidelity in the digital audio signal dig_aud, due to loss of the least significant information bits in the signal. However, it is contemplated that this loss of resolution will typically not be noticeable to the listener, considering that the digital gain will typically be present only for a brief period following the volume reduction input, lasting only until the output voltage X(t) from amplifier variable power supply 32 discharges to the desired level. The relatively "soft" passages for which the analog volume lag mostly occurs also limits the extent to which the loss of resolution and fidelity will be noticed by the listener.

On the other hand, increases in volume indicated by digital-domain analog volume control signal d_ana_gain will be immediately reflected in the voltage X(t) from amplifier variable power supply 32, and thus immediately applied by power amplifier 22 to the output audio signal. This of course assumes that the capacity and drive of amplifier variable power supply 32 is sufficient, which can be easily assured in most applications. Digital gain control 42 and digital gain stage 44 will typically not come into play for increasing the output volume. However, in the event that the power supply capacity is insufficient to charge the bulk storage capacitors at the desired volume adjustment rate, the digital gain stage 42 can be used to provide adjustment signal dig_gain_adj that applies gain compensation. In this case, referring to FIG. 4, digital gain stage 44 would apply a digital gain that is at the level of digital volume control signal dig_gain, but increased by the extent to which the voltage level X(t) is below the commanded analog value indicated by digital-domain analog volume control signal d_ana_gain.

Figure 6:
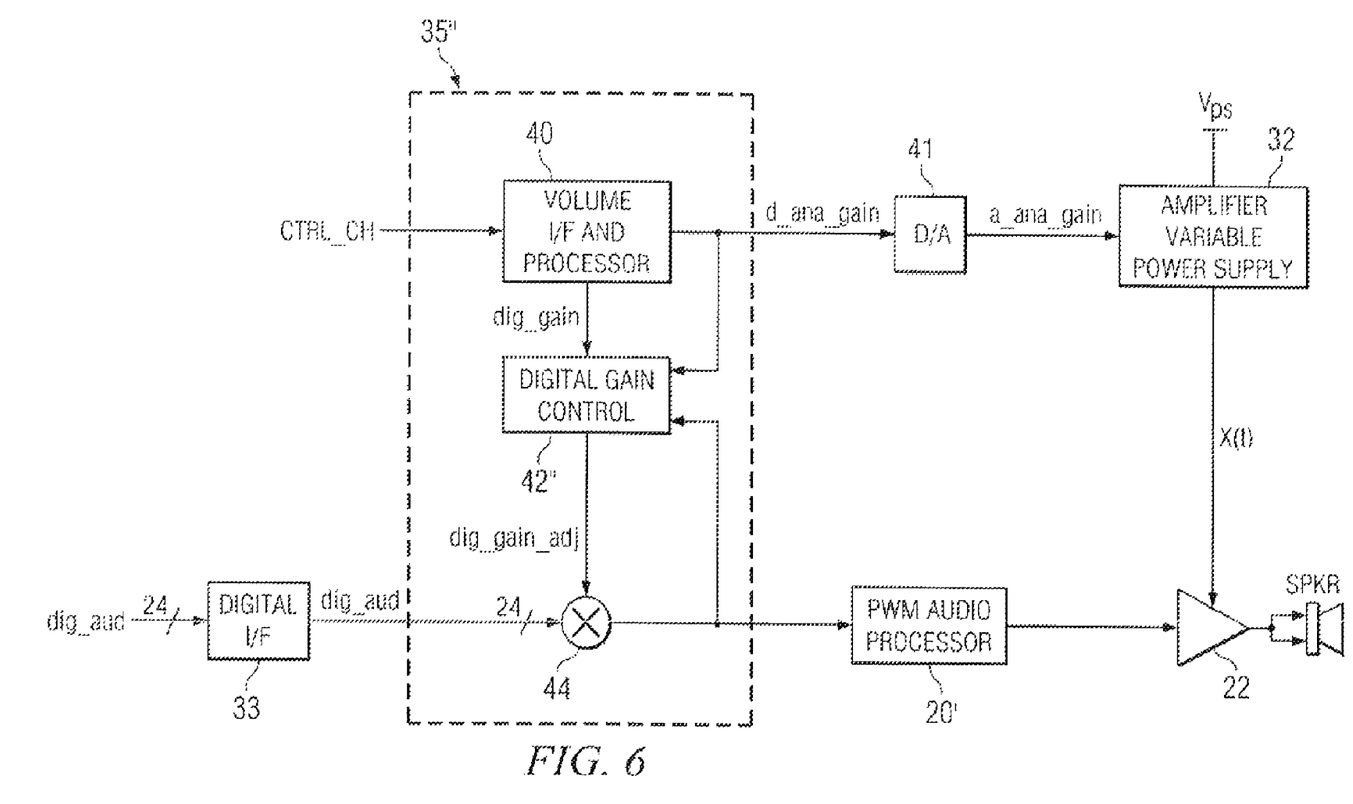
FIG. 6 is an electrical diagram, in block form, of output stage circuitry for a channel of a digital audio system such as shown in FIG. 3, constructed according to a second preferred embodiment of the invention.
Figure 7:
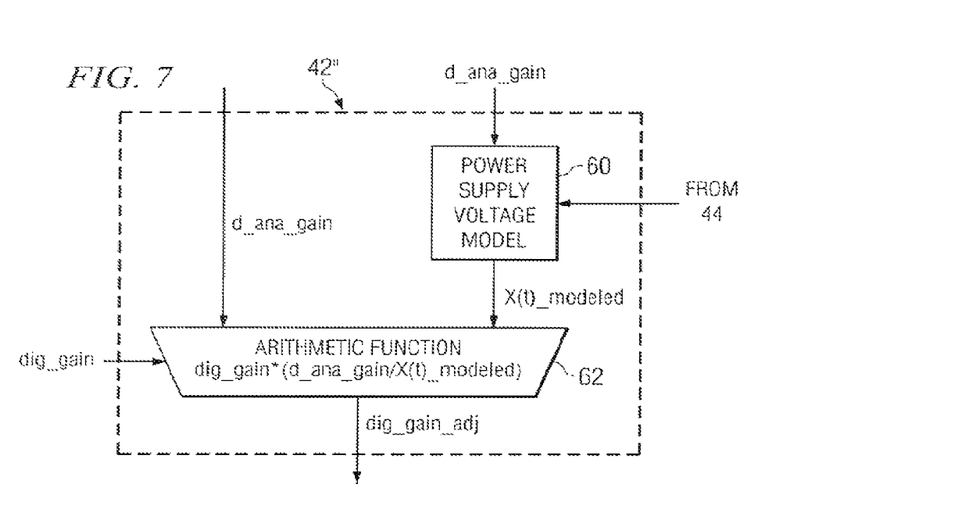
FIG. 7 is an electrical diagram, in block form, of volume control circuitry in the circuitry of FIG. 6, constructed according to the second preferred embodiment of the invention.

As evident from FIGS. 4 and 5 describing a first preferred embodiment of this invention, feedback control from amplifier variable power supply 32 is used to derive the temporary digital gain reduction in the digital audio signal. Alternatively, it is contemplated that the response of the analog volume control circuitry can be modeled or characterized sufficiently that the digital gain control may be realized without involving feedback from the output stages. Referring now to FIGS. 6 and 7, volume control circuit 35' according to a second preferred embodiment of the invention will now be described, in which feedback is not required for accurate operation.

FIG. 6 illustrates volume control circuit 35" according to this second preferred embodiment of the invention, as realized in combination with audio processor 20' and power amplifier 22 for a single audio channel, along with amplifier variable power supply 32. In this embodiment of the invention, analog volume control is applied to power amplifier 22 by way of volume interface and processor 40 of volume control circuit 35", which generates a digital version of analog volume control signal d_ana_gain in response to a command value for the desired output volume for this channel (or for all channels simultaneously) as received from system controller 30 over digital interface CTRL_CH. The digital signal d_ana_gain is converted by digital-to-analog converter 41 into an analog domain signal a_ana_gain. Amplifier variable power supply 32 adjusts the power supply bias voltage X(t) that is applied to power amplifier 22 in response to this analog volume control signal ana_gain, as described above.

And as also described above, the response of voltage X(t) to a reduction in the level of digital-domain analog volume control signal d_ana_gain can be slowed by the bulk storage capacitance of amplifier variable power supply 32 itself, depending on the level of the digital audio signal dig_aud as reflected in the PWM duty cycle applied to power amplifier 22. According to a second preferred embodiment of this invention, digital gain control 42" generates digital volume control signal dig_gain_adj to digital gain stage 44 based on a model or characterization of that response, which can be relied upon to some reasonable degree of accuracy. Considering that the duration of the digital gain reduction generated by digital gain control 42" is typically quite short, and also considering that this digital gain will be applied primarily in "soft" passages of the audio content, the model or characterization upon which this digital gain is based need not be particularly precise for good performance.

It is contemplated that, of course, those skilled in the art having reference to this specification will readily identify many ways in which such a model can be realized. Of course, any such model ought to be based on analysis or characterization of the response of amplifier variable power supply 32 to decreasing volume commands, to ensure high fidelity in the volume control without undue loss of response and performance. It is contemplated that those skilled in the art having reference to this specification will be readily able to produce and realize such a model for a given practical implementation, without undue experimentation. As such, this description will present an example of the construction of digital gain control 42" according to this second preferred embodiment of the invention, at a relatively high level, with reference to FIG. 7.

As shown in FIG. 7, digital gain control 42" includes power supply voltage model function 60. Power supply voltage model function 60 is preferably sequential logic circuitry or software functionality, capable of producing a modeled version of the power supply voltage X(t) given one or more values of digital-domain analog volume control signal d_ana_gain from volume interface and processor 40, and one or more digital values of the audio signal as presented by digital gain stage 44. The order of the model realized by power supply voltage model 60 may be a relatively simple first order model, or alternatively may be a higher-order model, including a sequence of the most recent values of the volume control signal and the audio content stream. It is contemplated, as mentioned above, that those skilled in the art having reference to this specification will be readily able to derive such a model with such fidelity to the actual operation of amplifier variable power supply 44 as optimized for the particular application.

The output of power supply voltage model 60 is, in this example, modeled power supply voltage X(t)_modeled. This digital value can then be applied to arithmetic function 62 which, similarly as arithmetic function 58' described above relative to FIG. 5b, Digital-domain analog volume control signal d_ana_gain and digital volume command signal dig_gain, both expressed as digital signal levels, are also applied to arithmetic function 62, as is digital volume command signal dig_gain. Similarly as described above, arithmetic function 62 produces digital adjustment signal level dig_gain_adj corresponding to the volume level indicated by digital volume command signal dig_gain, scaled by an amount corresponding to the ratio of the desired volume level (represented by the digital-domain volume control signal d_ana_gain) and the modeled volume level (represented by the digital signal X(t)_modeled from power supply voltage model 60). Digital gain control 42" applies this digital gain value to digital gain stage 44 (FIG. 6) as signal dig_gain_adj.

As before, the digital gain reduces the digital values (e.g., PCM values) of digital audio signal dig_aud, thus reducing the PWM duty cycle of the signals applied to power amplifier 22, in turn reducing the audio volume at speaker SPKR. This reduction in volume will tend to be short-lived, again based on the operation of digital filter 60 according to the modeled or characterized response of the system to volume reduction.

Of course, the particular manner in which the digital gain signal is generated by digital gain control 42" in response to reduced volume signals can vary from that illustrated in FIG. 7. As mentioned above, it is contemplated that those skilled in the art having reference to this specification will be readily able to derive such alternative implementations, without undue experimentation.

Figure 9:
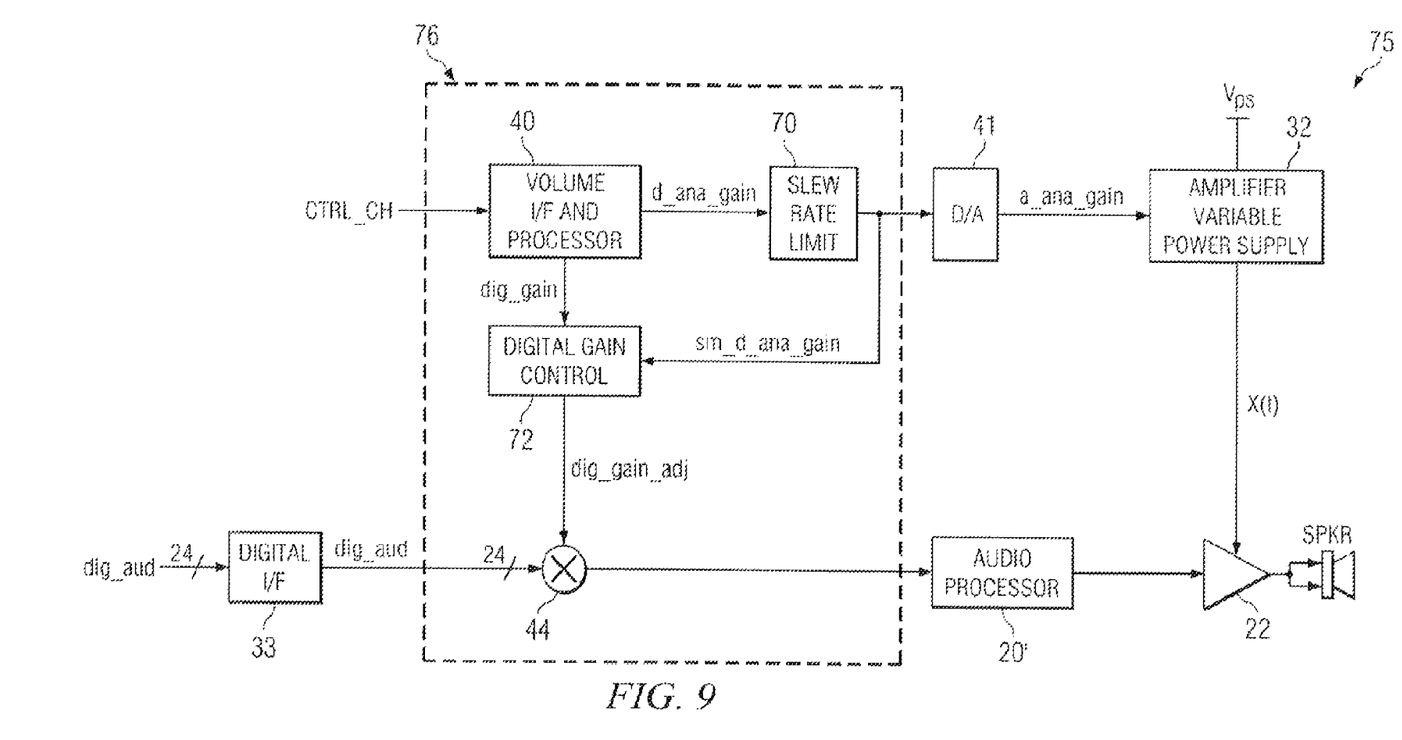
FIG. 9 is an electrical diagram, in block form, of output stage circuitry for a channel of a digital audio system such as shown in FIG. 3, constructed according to a third preferred embodiment of the invention

FIG. 9 illustrates volume control circuit 76 according to a third preferred embodiment of the invention. As in the examples of FIGS. 4 and 6, volume control circuit 76 is shown in digital audio receiver 75 of FIG. 9 as realized in combination with audio processor 20', amplifier variable power supply 32, and power amplifier 22 for a single audio channel, for clarity of this description; as will be described below, volume control circuit 76 may of course also be realized in a multiple-channel audio system. In this embodiment of the invention, analog volume control is applied to power amplifier 22 by way of volume interface and processor 40 of volume control circuit 76.

According to this third preferred embodiment of the invention, the actual power supply voltage X(t) produced by amplifier variable power supply 32 is not monitored or used in deriving the digital gain adjustment. Instead, the rate of change of the command signal applied to amplifier variable power supply 32 is controlled so that the actual power supply voltage X(t) remains in a steady-state, such that there is no difference between the control signal applied to amplifier variable power supply 32 and its output voltage. According to this embodiment of the invention, this control is attained by slew rate limiter 70, which receives the digital signal d_ana_gain from volume interface and processor 40, and that generates digital domain control signal sm_d_ana_gain at its output, which is coupled to analog-to-digital converter 41. ADC 41, as before, converts signal sm_d_ana_gain into analog domain signal a_ana_gain, for application to amplifier variable power supply 32.

As mentioned above, a problem addressed by this invention is the lag in the time at which the actual power supply voltage X(t) applied to power amplifier 22 falls, in response to a decrease in the analog volume control signal a_ana_gain. In this third embodiment of the invention, the bulk capacitance of amplifier variable power supply 32 is known, or has been characterized, to sufficient precision that slew rate limiter 70 can slow the rate of change of values of digital signal d_ana_gain, in generating digital domain control signal sm_d_ana_gain, to a rate that is at least as slow as the rate of change of actual power supply voltage X(t). As a result, it is unnecessary to monitor actual power supply voltage X(t) according to this embodiment of the invention, which greatly reduces the circuitry required to realize volume control circuit 75. More specifically, volume control circuit 75 requires neither an analog-to-digital converter to feed back the actual power supply voltage X(t), nor the derivation of a model of the time response of amplifier variable power supply 32 and power amplifier 22, in response to reductions of the audio volume.

Slew rate limiter 70 can be realized by conventional digital filter circuitry. Preferably, the reduction in rate of change reflected by slew rate limiter 70 need only be applied to falling values of the audio volume command signal. As mentioned above, increases in the actual power supply voltage X(t) as produced by amplifier variable power supply 32 occur very rapidly in response to increases in the volume command signal. It is contemplated that those skilled in the art, having reference to this specification, will be readily able to realize slew rate limiter 70, as appropriate for particular applications.

Digital gain control 72 is realized similarly as digital gain control 42 shown in FIGS. 5a and 5b, and described above. However, according to this embodiment of the invention, The digital signal sm_d_ana_gain at the output of slew rate limiter 70 is applied at an input to digital gain control circuit 72, in place of actual power supply voltage X(t), converted into the digital domain. Digital gain control 72 also receives digital volume command signal dig_gain. The particular circuitry involved in digital gain control 72 depends, as before, on whether the digital values are in "dB space", in which case digital gain control 72 may be constructed similarly as shown in FIG. 5a, or as linear values, in which case digital gain control 72 may be constructed similarly as shown in FIG. 5b. In any case, digital gain control 72 produces a digital adjustment signal dig_gain_adj that represents the gain reduction to be applied by digital gain stage 44, to compensate for the slow response of actual power supply voltage X(t) to decreases in the volume command signal.

The preferred embodiments of the invention described above relative to FIGS. 4 through 7 and 9 illustrate the operation of volume control circuitry 35 in connection with a single audio channel. As mentioned above, each audio channel may have its own individual volume control function that controls the volume of that channel separately from the other channels; in that regard, each channel would have a separately controllable amplifier variable power supply, and its own digital gain control for controlling the digital gain stage for that channel in response to modulation of the volume control signal for that channel.

Figure 8:
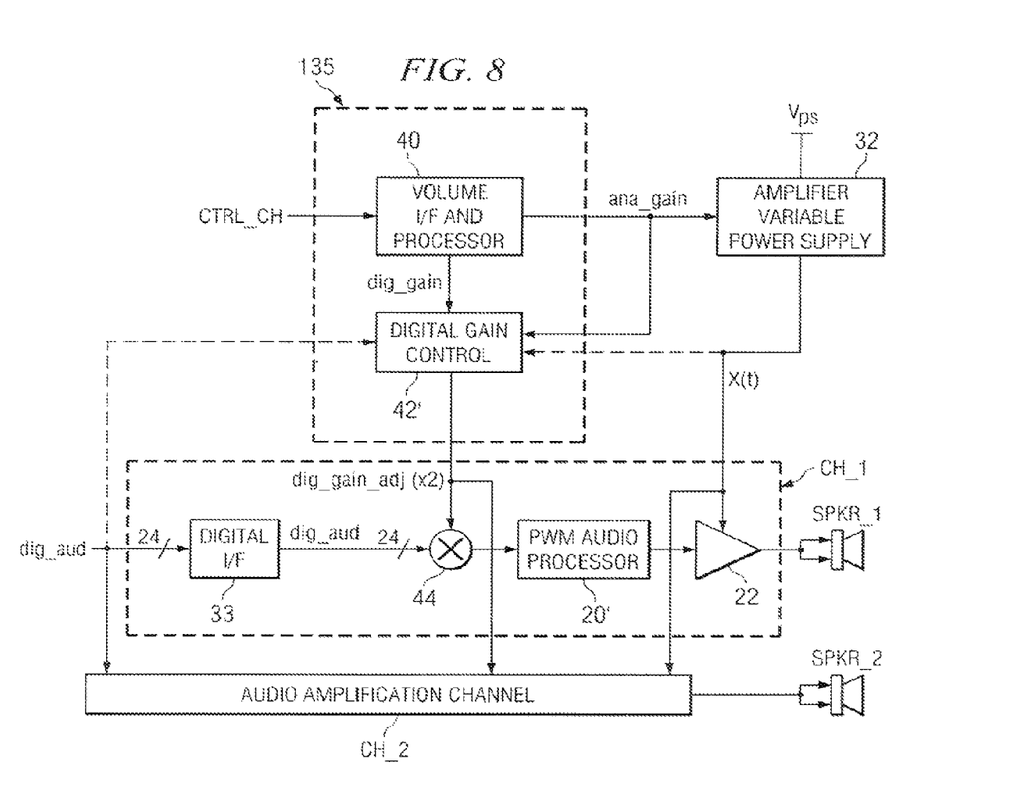
FIG. 8 is an electrical diagram, in block form, of volume control circuitry according to the preferred embodiments of the invention, as applied to a multiple channel audio system.

Alternatively, or in combination with such individual channel volume control, a globally volume control function may be realized according to the preferred embodiments of the invention, in which a single volume control signal or command controls the volume for all channels simultaneously, analogous to a single volume knob or remote actuation. FIG. 8 illustrates such a global volume control function, in connection with two audio channels CH_1, CH_2 and corresponding speakers SPKR_1, SPKR_2; it will, of course, be understood that any number of additional audio channels may be similarly controlled along with channels CH_1, CH_2 shown in this example.

In the example of FIG. 8, a single amplifier variable power supply 32 applies bias voltage X(t) to multiple audio channels CH_1, CH_2 in parallel. In addition, volume control circuit 135 applies its digital volume control signal dig_gain to digital gain stage 44 in each of the multiple audio channels CH_1, CH_2, also in parallel. Volume control circuit 135 is constructed and operates in a similar manner as discussed above relative to the embodiments of the invention shown in FIGS. 4 through 7 and 9. In this regard, digital gain control 42 within volume control circuit 135 may receive inputs corresponding to the current output voltage X(t) from amplifier variable power supply 32, if implemented to respond to this feedback as described above relative to FIGS. 4, 5a, and 5b, or may receive inputs corresponding to the current digital audio signal dig_aud, if implemented according to the embodiment of the invention described above relative to FIGS. 6, 7, and 9. Digital gain control 42 in this multi-channel embodiment will then generate digital gain adjust signal dig_gain_adj as a vector, including a volume signal and also an adjustment to that volume signal based on the slowed response of the amplifier variable power supply 32 (as monitored or as modeled), for each of the multiple channels. The volume of each of the channels can thus be controlled individually and also in concert with one another, as desired by the user. It is contemplated that those skilled in the art, having reference to this specification, will be readily able to realize volume control according to this invention in this and other multiple audio channel systems, as desired for the particular system implementation.

According to each of the embodiments of this invention, substantial improvement in the fidelity and performance of digital audio systems, particularly in reducing volume on command, is provided. The immediacy of reduced volume is attained, according to this invention, without requiring external components, such as shunt loads, which consume power and generate substantial heat in the system. In addition, any loss of fidelity or resolution in the audio signal is minimal, from the standpoint of the listener, considering that the digital gain is applied only for brief periods, and typically in connection with soft volume passages. This invention is also contemplated to be useful and beneficial in connection with a wide range of digital audio systems, ranging from portable and hand-held digital audio systems to large-scale audio-video systems for the home and commercial installations.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A digital audio circuit comprising:
    a power amplifier that generates an output drive signal responsive to a digital audio signal;
    a digital gain stage that adjusts an amplitude of the digital audio signal prior to application to the power amplifier;
    a variable power supply that biases the power amplifier to a voltage corresponding to a volume control signal; and
    digital gain control circuitry that applies a control signal to the digital gain stage to temporarily reduce the amplitude of the digital audio signal responsive to a reduction of a desired volume indicated by the volume control signal, wherein the digital gain control circuitry includes:
        add/subtract circuitry having an input coupled to receive a signal corresponding to an output voltage from the variable power supply and an input coupled to receive the volume control signal; and
        comparison circuitry that generates the control signal to the digital gain stage responsive to the output voltage from the variable power supply at a gain level exceeding that indicated by the volume control signal.

2. The digital audio circuit of claim 1, wherein the add/subtract circuitry is coupled to the variable power supply to monitor the output voltage from the variable power supply.

3. The digital audio circuit of claim 1, wherein the digital audio circuit further comprises a slew rate limiter that receives a digital volume command signal and that produces a volume control signal coupled to the variable power supply that changes at a slowed rate of change in response to reduction in the value of the digital volume command signal, wherein the add/subtract circuitry is coupled to the slew rate limiter so that the signal corresponding to the output voltage corresponds to the volume control signal from the slew rate limiter.

4. The digital audio circuit of claim 1, wherein the digital gain control circuitry comprises:
    modeling circuitry that generates a modeled power supply voltage signal responsive to the volume control signal indicating a reduction of the desired volume; and
    control circuitry that generates the control signal to the digital gain stage responsive to the modeled power supply voltage signal.

5. The digital audio circuit of claim 4, wherein the modeling circuitry generates the modeled power supply voltage signal responsive to the digital audio signal output by the digital gain stage.

6. The digital audio circuit of claim 4, wherein the control circuitry has an input coupled to receive the modeled power supply voltage signal and an input coupled to receive the volume control signal and generates the control signal to the digital gain stage corresponding to the volume control signal, scaled by an amount responsive to the modeled power supply voltage signal exceeding that indicated by the volume control signal.

7. The digital audio circuit of claim 1, wherein the digital audio circuit further comprises modulation circuitry having an input coupled to receive the digital audio signal from the digital gain stage and that generates a modulated drive signal to an input of the power amplifier responsive to the digital audio signal.

8. The digital audio circuit of claim 1, wherein the digital audio circuit further comprises:
    a plurality of power amplifiers, wherein each power amplifier drives an associated one of a plurality of audio channels, and wherein each power amplifier is biased by the variable power supply; and
    a plurality of digital gain stages, wherein each digital gain stage is associated with one of the plurality of audio channels, and wherein each digital gain stage adjusts the amplitude of a digital audio signal for that audio channel prior to application of that signal to the power amplifier associated with that audio channel.

9. The digital audio circuit of claim 8, wherein the digital gain control circuitry is coupled to each of the plurality of digital gain stages.

10. The digital audio circuit of claim 8, wherein the digital gain control circuitry further comprises a plurality of digital gain control circuits, wherein each digital gain control circuit is associated with one of the audio channels so as to apply a control signal to the digital gain stage of its associated audio channel to temporarily reduce the amplitude of the digital audio signal responsive to a reduction of a desired volume indicated by a volume control signal for that associated audio channel.

11. A digital audio circuit comprising:
a power amplifier that generates an output drive signal responsive to a digital audio signal;
a digital gain stage that adjusts an amplitude of the digital audio signal prior to application to the power amplifier;
a variable power supply that biases the power amplifier to a voltage corresponding to a volume control signal; and
digital gain control circuitry that applies a control signal to the digital gain stage to temporarily reduce the amplitude of the digital audio signal responsive to a reduction of a desired volume indicated by the volume control signal, wherein the digital gain control circuitry includes arithmetic circuitry having an input coupled to receive a signal corresponding to an output voltage from the variable power supply and an input coupled to receive the volume control signal, for generating the control signal to the digital gain stage, scaled by an amount responsive to the output voltage from the variable power supply exceeding that indicated by the volume control signal.

12. The digital audio circuit of claim 11, wherein the arithmetic circuitry is coupled to the variable power supply to monitor the output voltage from the variable power supply.

13. The digital audio circuit of claim 11, wherein the digital audio circuit further comprises a slew rate limiter that receives a digital volume command signal and that produces a volume control signal coupled to the variable power supply that changes at a slowed rate of change in response to reduction in the value of the digital volume command signal, wherein the arithmetic circuitry is coupled to the slew rate limiter so that the signal corresponding to the output voltage corresponds to the volume control signal from the slew rate limiter.

14. A method of controlling the audio volume in a digital audio system, the method comprising the steps of:
receiving a command indicating a desired volume reduction for an audio channel;
applying a control signal to a variable power supply corresponding to the desired volume reduction, wherein the variable power supply applies a bias voltage to a power amplifier for that audio channel corresponding to the control signal, and wherein the power amplifier drives a speaker responsive to a digital audio signal for the audio channel; and
temporarily reducing the amplitude of the digital audio signal applied to the power amplifier for the audio channel responsive to receiving the command indicating a desired volume reduction for the audio channel, wherein the reducing step further comprises:
monitoring the bias voltage applied to the power amplifier;
comparing the monitored bias voltage to a desired volume signal; and
responsive to the bias voltage exceeding a voltage corresponding to the desired volume signal, reducing the amplitude of the digital audio signal.

15. The method of claim 14, wherein the reducing step further comprises:
generating a digital gain control signal corresponding to a difference between the monitored bias voltage and the desired volume signal; and
applying the digital gain control signal to a digital gain stage that receives an input digital audio signal and produces an output digital audio signal, coupled to the power amplifier, based on the input digital audio signal and according to the digital gain control signal.

16. The method of claim 14, wherein the reducing step further comprises:
generating a digital gain control signal scaled by a ratio of the monitored bias voltage and the desired volume signal; and
applying the digital gain control signal to a digital gain stage that receives an input digital audio signal and produces an output digital audio signal, coupled to the power amplifier, based on the input digital audio signal and according to the digital gain control signal.

17. The method of claim 14, wherein the method further comprises terminating the reducing of the amplitude of the digital audio signal, responsive to the monitored bias voltage corresponding to the desired volume signal.

18. The method of claim 14, wherein the applying step further comprises:
generating a digital command signal responsive to the received command; and
generating a slowed digital command signal responsive to the digital command signal;
wherein the reducing step further comprises:
comparing values of the slowed digital command signal to values of the digital command signal; and
responsive to values of the slowed digital command signal exceeding values of the digital command signal, reducing the amplitude of the digital audio signal.

19. The method of claim 14, wherein the reducing step further comprises:
generating a digital gain control signal responsive to a reduction of a desired volume signal.

20. The method of claim 19, wherein the generating step further comprises:
generating a modeled power supply voltage signal responsive to the reduction in the desired volume signal; and
applying the digital gain control signal to a digital gain stage that receives an input digital audio signal and produces an output digital audio signal, coupled to the power amplifier, based on the input digital audio signal and according to the modeled power supply voltage signal.

21. The method of claim 20, wherein the generating step generates the modeled power supply voltage signal according to a current value of the digital audio signal.

22. The method of claim 14, wherein the method further comprises:
converting the digital audio signal to a modulated signal; and
applying the modulated signal to the power amplifier.

* * * * *